US011287447B2

(12) United States Patent
Peschke

(10) Patent No.: US 11,287,447 B2
(45) Date of Patent: Mar. 29, 2022

(54) MEASUREMENT INPUT CIRCUIT AND MEASUREMENT DEVICE

(71) Applicant: Rohde & Schwarz GmbH & Co. KG, Munich (DE)

(72) Inventor: Martin Peschke, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 116 days.

(21) Appl. No.: 15/632,458

(22) Filed: Jun. 26, 2017

(65) Prior Publication Data

US 2018/0372779 A1 Dec. 27, 2018

(51) Int. Cl.
*G01R 1/30* (2006.01)
*G01R 13/22* (2006.01)
*G01R 1/067* (2006.01)

(52) U.S. Cl.
CPC ........... *G01R 1/30* (2013.01); *G01R 1/06766* (2013.01); *G01R 13/22* (2013.01)

(58) Field of Classification Search
CPC .. G01R 1/06766; G01R 1/06777; G01R 1/30; G01R 13/22
See application file for complete search history.

(56) References Cited

U.S. PATENT DOCUMENTS

| 4,034,291 A * | 7/1977 | Allen | G01R 13/20 324/121 R |
| 4,382,227 A * | 5/1983 | Olivenbaum | G01R 1/206 324/110 |
| 4,473,857 A * | 9/1984 | Winter | G01R 1/06766 323/369 |
| 4,525,688 A * | 6/1985 | Murphy | H03H 7/24 330/125 |
| 5,107,201 A * | 4/1992 | Ogle | G01R 15/06 324/149 |

(Continued)

FOREIGN PATENT DOCUMENTS

DE 10 2015 203 651 A1 9/2016
GB 2 264 788 A 9/1993

(Continued)

OTHER PUBLICATIONS

Extended European Search Report for European Patent Application No. 17181910.5, dated Feb. 13, 2018, 9 pages.

(Continued)

*Primary Examiner* — Walter L Lindsay, Jr.
*Assistant Examiner* — Milton Gonzalez
(74) *Attorney, Agent, or Firm* — Westman, Champlin & Koehler, P.A.

(57) ABSTRACT

A measurement input circuit for a measurement device for measuring an electric signal in a device under test comprises a signal input that receives the electronic signal from the device under test and provides the received electronic signal at a signal node, a direct signal coupling path that is coupled between the signal node an electrical ground and comprises a first impedance value, an alternating signal coupling path that is coupled between the signal node and the electrical ground, and comprises a second impedance value that is lower than the first impedance value, and a signal output that is coupled to the signal node and outputs the received electronic signal.

12 Claims, 6 Drawing Sheets

(56) References Cited

U.S. PATENT DOCUMENTS

| | | | |
|---|---|---|---|
| 5,172,051 A * | 12/1992 | Zamborelli | G01R 1/06772 324/149 |
| 5,373,410 A * | 12/1994 | Schreiber | G01R 15/125 361/119 |
| 5,392,001 A | 2/1995 | Uhling et al. | |
| 6,175,228 B1 * | 1/2001 | Zamborelli | G01R 1/06766 324/149 |
| 6,307,363 B1 * | 10/2001 | Anderson | G01R 1/06772 324/149 |
| 6,483,284 B1 * | 11/2002 | Eskeldson | G01R 1/06772 324/121 R |
| 6,836,136 B2 * | 12/2004 | Aghaeepour | G01R 31/3192 324/73.1 |
| 7,013,230 B2 * | 3/2006 | Sekino | G01R 31/31926 702/117 |
| 7,256,575 B2 * | 8/2007 | Pollock | G01R 1/06766 324/126 |
| 7,402,991 B2 * | 7/2008 | Pollock | H03H 7/24 324/126 |
| 7,728,610 B2 * | 6/2010 | Frame | H03H 7/24 324/754.03 |
| 8,278,940 B2 * | 10/2012 | Bartlett | G01R 1/06766 324/601 |
| 8,436,624 B2 * | 5/2013 | Bartlett | G01R 35/005 324/601 |
| 8,456,173 B2 | 6/2013 | Knierim et al. | |
| 9,667,233 B2 | 5/2017 | Peschke | |
| 2003/0025485 A1 * | 2/2003 | McTigue | G01R 1/20 324/72.5 |
| 2016/0261254 A1 | 9/2016 | Peschke | |
| 2018/0328961 A1 * | 11/2018 | Mende | G01R 1/06766 |

FOREIGN PATENT DOCUMENTS

| | | |
|---|---|---|
| JP | 06331657 A * | 12/1994 |
| JP | 2002090394 A * | 3/2002 |
| JP | 2009145172 A * | 7/2009 |

OTHER PUBLICATIONS

Haga, Kenichiro et al., "High-frequency Active Probe for Oscilloscope with Optimum Design for the SICE-ICASE International Joint Conference 2006 (SICE-ICCAS 2006) Oct. 18-21, 2006 in Bexco, Busan, Korea", SICE-ICASE International Joint Conference 2006, 89-950038-5-5 98560/06/$10 © 2006 ICASE, 4 pages.

Rohde&Schwarz User Manual, R&S@ RT-ZPR20 Power-Rail Probe User Manual, 1800.5035.02-01, © 2017 Rohde & Schwarz GmbH & Co. KG, 42 pages.

* cited by examiner

MEASUREMENT INPUT CIRCUIT AND MEASUREMENT DEVICE

TECHNICAL FIELD

The present invention relates to a measurement input circuit. The present invention further relates to a measurement device.

BACKGROUND

Although applicable in principal to any system that is used to measure electric signals, the present invention and its underlying problem will be hereinafter described in combination with measurement devices like e.g. oscilloscopes.

When measuring electronic signals in a device under test it is important to take into account the impedance of the device under test as well as of the measurement device.

For example, if the measurement device has a high input impedance, like e.g. 1 MΩ, the source of the test signal (e.g. the device under test) will suffer only a low source loading. Such a high impedance coupling may be used for high voltages of e.g. up to 300 V. The bandwidth with such a high impedance coupling is usually limited to about 500 MHz.

On the other hand, if the measurement device has a low input impedance, like e.g. 50Ω, the source of the test signal (e.g. the device under test) will suffer a higher source loading. Therefore, the low impedance coupling may be used for low voltages of e.g. up to 5 V or 12 V. The bandwidth with such a low impedance coupling may reach up to about 100 GHz or more.

Another parameter for performing a signal measurement is the type of coupling, i.e. AC coupling or DC coupling. With AC coupling the DC component of the test signal is eliminated e.g. to see low amplitude ripples in the signal. With DC coupling the whole signal is transmitted to the measurement device.

Usually, a user will therefore have to select an input impedance for the measurement device and the type of coupling. Such measurements therefore offer little flexibility and multiple measurements have to be performed with different configurations of the measurement device.

Against this background, the problem addressed by the present invention is to allow more flexible measurements.

SUMMARY

The present invention solves this object by a measurement input circuit and by a measurement device.

Accordingly it is provided:

A measurement input circuit for a measurement device for measuring an electronic signal in a device under test, the measurement input circuit comprising a signal input, e.g. a test connector, that receives the electronic signal from the device under test and provides the received electronic signal at a signal node, a direct signal coupling path that is coupled between the signal node and an electrical ground and comprises a first impedance value, an alternating signal coupling path that is coupled between the signal node and the electrical ground and comprises a second impedance value that is lower than the first impedance value, and a signal output that is coupled to the signal node and outputs the received electronic signal.

Further, it is provided:

A measurement device, e.g. an oscilloscope, for measuring an electronic signal in a device under test, the measurement device comprising a measurement input circuit, the measurement input circuit comprising a signal input that receives the electronic signal from the device under test and provides the received electronic signal at a signal node, a direct signal coupling path that is coupled between the signal node and an electrical ground and comprises a first impedance value, an alternating signal coupling path that is coupled between the signal node and the electrical ground, and comprises a second impedance value that is lower than the first impedance value and a signal output that is coupled to the signal node and outputs the received electronic signal.

The present invention is based on the finding that direct signals, like e.g. a DC signal (Direct Current) or a direct voltage signal, can be blocked and that a direct signal coupling path and an alternating signal coupling path may be provided in parallel.

The present invention therefore provides the measurement input circuit. The measurement input circuit may e.g. be provided as a separate circuit on a substrate and with a dedicated housing. Such a measurement circuit may e.g. be connected via a connector to a measurement device, like e.g. an oscilloscope. Alternatively, the components of the measurement input circuit may be included in a measurement device or may be distributed in a measurement device and a dedicated measurement probe that are coupled by connectors and/or cables.

The signal input may e.g. comprise a connector for connecting the device under test, DUT, to the measurement input circuit. Such a connector may comprise a metallic or conductive outer shielding and inner contacts that are covered by the shielding, when the connector is coupled to the respective counterpart. A cable may e.g. be provided that connects the DUT to the signal input. Such a cable may also comprise a conductive shielding with inner signal conductors. The electronic signal that has to be measured is provided to a signal node of the measurement input circuit via the signal input.

A direct signal coupling path and an alternating signal coupling path are provided electrically in parallel between the signal node and an electrical ground of the measurement input circuit. The direct signal coupling path or DC signal coupling path may be seen as a low impedance DC path between the signal node and the electrical ground. The alternating signal coupling path or AC signal coupling path may be seen as a path for AC signals only, e.g. a signal path that blocks DC signals.

By providing the direct signal coupling path and the alternating signal coupling path in parallel, the signals that are usually measured separately, i.e. low frequency or DC signals and high frequency signals, will both be present at the signal node.

The signal output is provided to output the electric signals as received from the DUT and present at the signal node. The signal output may e.g. comprise a connector or the like analogous to the signal input.

The measured electronic signal may then e.g. be further processed by elements of a measurement device that uses the measurement input circuit.

Further embodiments of the present invention are subject of the further subclaims and of the following description, referring to the drawings.

In a possible embodiment, the direct signal coupling path may comprise a first resistor with a first resistance between the signal node and the electrical ground. The first resistance may especially comprise a resistance between 10 kΩ and 100 MΩ, especially a 50 kΩ resistance or a 1 MΩ resistance or a 10 MΩ resistance.

Direct signal coupling may be performed with a simple resistor. Such a resistor is a simple electric element with two contacts and a resistive element between the two contacts. The relatively high resistance values of the first resistor provide a low loading to the source, i.e. the DUT.

In a possible embodiment, the first resistor may comprise a first tunable resistor. The tunable resistor may be tunable to at least two first resistance values. Possible resistance values range between 10 kΩ and 100 MΩ, and may e.g. comprise a 50 kΩ resistance or a 1 MΩ resistance or a 10 MΩ resistance.

A tunable resistor may e.g. be a potentiometer that may be manually tuned by a user of the measurement input circuit or the measurement device. Alternatively, the tunable resistor may e.g. be an electronically controllable or digital potentiometer. As further alternative, the tunable resistor may also comprise a plurality of resistors arranged electrically in parallel. Every resistor may be provided with a switch that allows controllably activating or deactivating the respective switch. Activating in this respect means closing the electrical connection between the signal node and the respective resistor or the respective resistor and ground such that current may flow through the resistor.

In a possible embodiment, the alternating signal coupling path may comprise an alternating signal coupling element with a second resistor that comprises a second resistance in series between the signal node and the electrical ground. The second resistance may comprises a resistance between 10 Ω and 100Ω, especially a 50 Ω resistance or a 75 Ω resistance or a 100Ω resistance.

The alternating signal coupling path as already indicated above, only allows AC signals to pass through. The alternating signal coupling element may be the element that performs the signal separation of DC and AC signals. The second resistor therefore represents the impedance that is provided for such AC signals. Usually high frequency signals must be measured using a low impedance coupling. The impedance of 10 Ω to 100Ω serves the purpose of a low impedance coupling for these signals.

The alternating signal coupling element may e.g. comprise a specific frequency dependent filter or attenuation property.

The alternating signal coupling element may e.g. comprise a specific cutoff frequency. The cutoff frequency in the case of the alternating signal coupling element may be a lower cutoff frequency. The alternating signal coupling element may therefore let signals pass through that comprise a higher frequency than the cutoff frequency. It is understood, that real high-pass filters, especially of first order, will not comprise a step-shaped frequency response but a continuous curve-shaped frequency response.

In a possible embodiment, the alternating signal coupling element may comprise a capacitor. The capacitor may e.g. comprise a capacitance between 1 μF and 100 nF, especially between 1 nF and 10 nF, and more especially of 2 nF.

The capacitor may e.g. be a SMD or through-hole element that may be used in an electric circuit. As an alternative, the capacitor may also be formed on a substrate with traces or conductors, e.g. copper traces on a PCB. In combination with the second resistor, the capacitor forms a high-pass filter that only lets signals pass through that have a frequency higher than the cutoff frequency of the high-pass filter.

In a possible embodiment, the capacitor may comprise a tunable capacitor that is tunable to at least two capacitance values between 1 μF and 100 nF. Possible capacitance values are 1 nF, 2 nF and 5 nF.

The tunable capacitor may e.g. comprise a plurality of capacitors with switches that may be selectively coupled electrically in parallel by closing the respective switches.

In a possible embodiment, the second resistor may comprise a second tunable resistor and may be tunable to at least two second resistance values. Possible second resistance values range between 10 Ω and 100Ω, and may e.g. be 50Ω and 75Ω.

Regarding the second tunable resistor the above said about the first tunable resistor also applies.

The combination of the tunable capacitor and the tunable second resistor provide a very flexible alternating signal coupling path that may e.g. be tuned by a user according to the requirements of the respective measurement task.

The tuning of the first resistor, the second resistor and the capacitor may e.g. be performed by a controller of a measurement device. The measurement device may comprise a user interface and a user may e.g. select via the user interface a respective measurement mode or settings for the first resistor, the second resistor and the capacitor. The user interface may e.g. comprise a display with a respective GUI. The measurement device may further comprise a touch screen or other input elements, like e.g. a mouse or a keyboard for a user to perform the respective selections.

In a possible embodiment, the measurement input circuit may comprise a measurement amplifier. An input port of the measurement amplifier may be connected to the signal node. The measurement amplifier may e.g. comprise an operational amplifier or opamp with further surrounding electric elements like resistors or the like. Such an operational amplifier may e.g. comprise one or two signal inputs and an amplifier output that provides the amplified signal. Usually the inputs of the operational amplifier will comprise a high impedance and provide no additional load to the signal source, e.g. the DUT.

If the input of the measurement amplifier is coupled to signal node, the measurement amplifier directly receives all signals that are present at the signal node. The measurement amplifier may therefore directly amplify all relevant signals.

In a possible embodiment, the measurement amplifier may be a broadband amplifier with a bandwidth between 1 GHz and 100 GHz, especially 5 GHz or 10 GHz.

In a possible embodiment, the direct signal coupling path may comprise an offset circuit with an offset source and a summing or differentiating circuit, e.g. with an operational amplifier. The offset source may be a voltage or current source and may be coupled between the electrical ground and the first resistor. An input of the summing or differentiating circuit may be coupled between the offset source and the first resistor. The summing or differentiating circuit forms the sum or difference of the electric signal and an output signal of the offset source.

The offset circuit may serve to compensate for a DC signal component of the electric signal that is measured. The offset circuit may also serve to compensate an offset voltage in the measurement amplifier.

In a possible embodiment, a first input of the measurement amplifier may be connected to a node between the alternating signal coupling element and the second resistor. A second input of the measurement amplifier may be connected to an output of the summing or differentiating circuit.

The measurement amplifier may therefore receive the high frequency signals via the alternating signal coupling path at its first input. The second input may then be provided with a compensation signal from the summing or differentiating circuit.

In a possible embodiment, the measurement amplifier may comprise an active summing or differentiating amplifier. Such an active summing or differentiating amplifier may e.g. comprise an operational amplifier with respective resistors and/or capacitors.

In a possible embodiment, the output of the summing or differentiating circuit may be connected to the node between the alternating signal coupling element and the second resistor.

The combination of the DC and the AC signals is implicitly performed by providing the output of the summing or differentiating circuit to the node between the alternating signal coupling element and the second resistor. Therefore, the signals may be combined even without using a measurement amplifier.

In a possible embodiment, the measurement input circuit may comprise a mode switch that puts the measurement input circuit in a high impedance mode or a low impedance mode or a hybrid mode.

The mode switch may e.g. comprise a plurality of changeover switches that may e.g. serve to activate or bypass the direct signal coupling path and/or the alternating signal coupling path. A changeover switch may e.g. couple the signal node either with the input of the direct signal coupling path or ground or leave the connection unconnected. Another changeover switch may e.g. couple the signal node either with the input of the alternating signal coupling path or ground or leave the connection open. The switches may e.g. be controlled by a controller of the measurement device based on user input.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
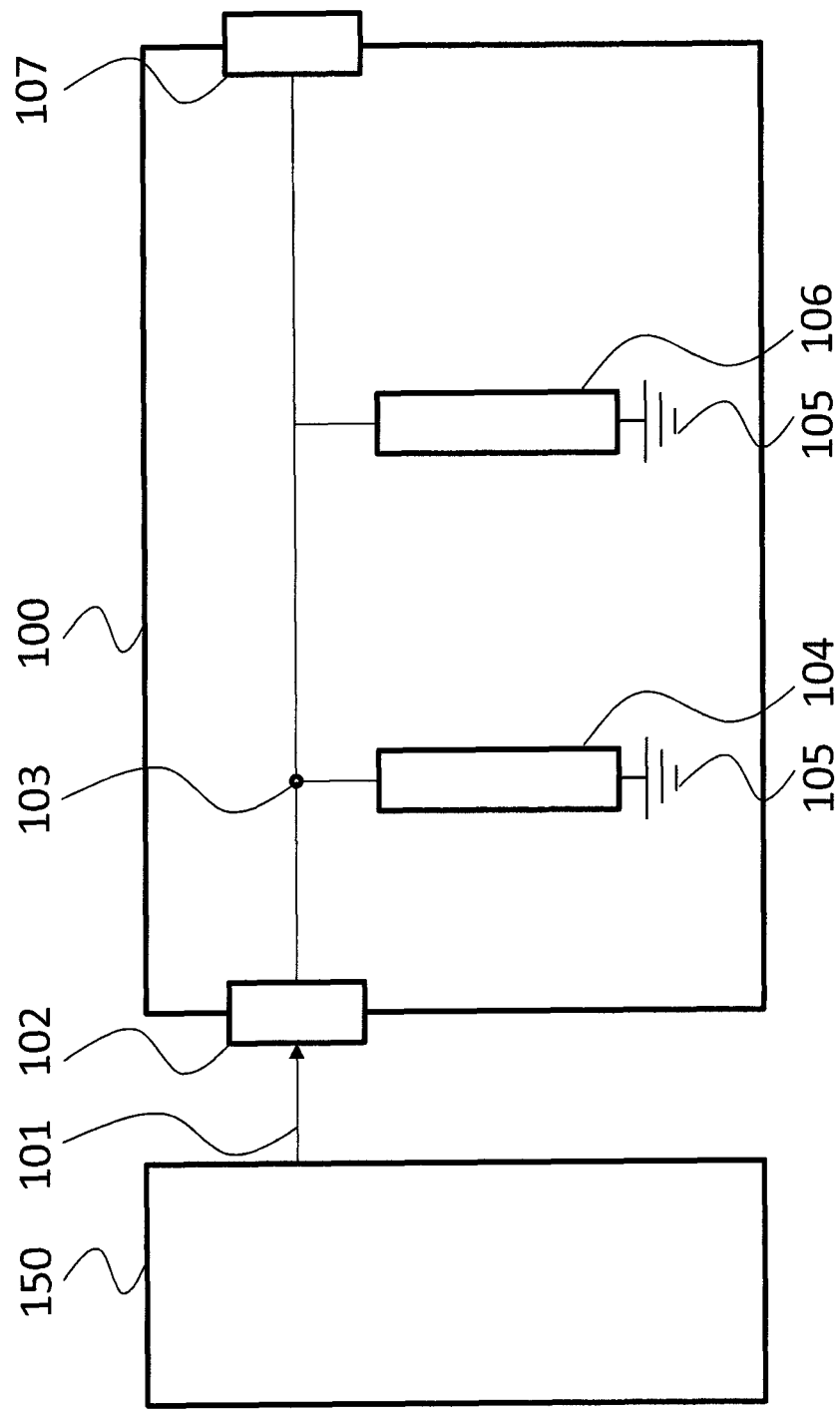
FIG. 1 shows a block diagram of an embodiment of a measurement input circuit according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of an embodiment of a measurement input circuit 100. The measurement input circuit 100 serves to couple a device under test 150 to a measurement device (see e.g. FIG. 6) in order to measure an electric signal 101. The measurement input circuit 100 performs the input coupling of the device under test 150 and the measurement device.

The measurement input circuit 100 comprises a signal input 102 that is coupled to a signal node 103. The signal input 102 may e.g. be a connector 102. Such a connector 102 may e.g. be coupled to the device under test 150 via a cable, like e.g. a 50Ω cable.

The measurement input circuit 100 further comprises a direct signal coupling path 104 that is coupled between the signal node 103 and an electric ground 105. In addition, the measurement input circuit 100 comprises an alternating signal coupling path 106 that is coupled between the signal node 103 and the electric ground 105. Further, a signal output 107 is coupled to the signal node 103.

The direct signal coupling path 104 and the alternating signal coupling path 106 both provide different types of couplings. The direct signal coupling path 104 performs a DC coupling to the device under test 150 with a high impedance. The alternating signal coupling path 106 in contrast performs an AC coupling to the device under test 150 with a low impedance that is adequate for high frequency signals. At the same time the alternating signal coupling path 106 may block DC signals. This means that the low impedance of the alternating signal coupling path 106 will not be applied to the DC signals. The combination of the direct signal coupling path 104 and the alternating signal coupling path 106 therefore provides parallel coupling for DC or low frequency and AC signals.

At the signal node 103 the signal output 107 therefore acquires the DC or low frequency part and the AC part of the electric signal 101. The electric signal 101 may then be measured e.g. with a measurement device.

With the arrangement of the measurement input circuit 100 therefore both types of signals, DC or low frequency and AC signal, may be measured in the DUT at the same time.

Figure 2:
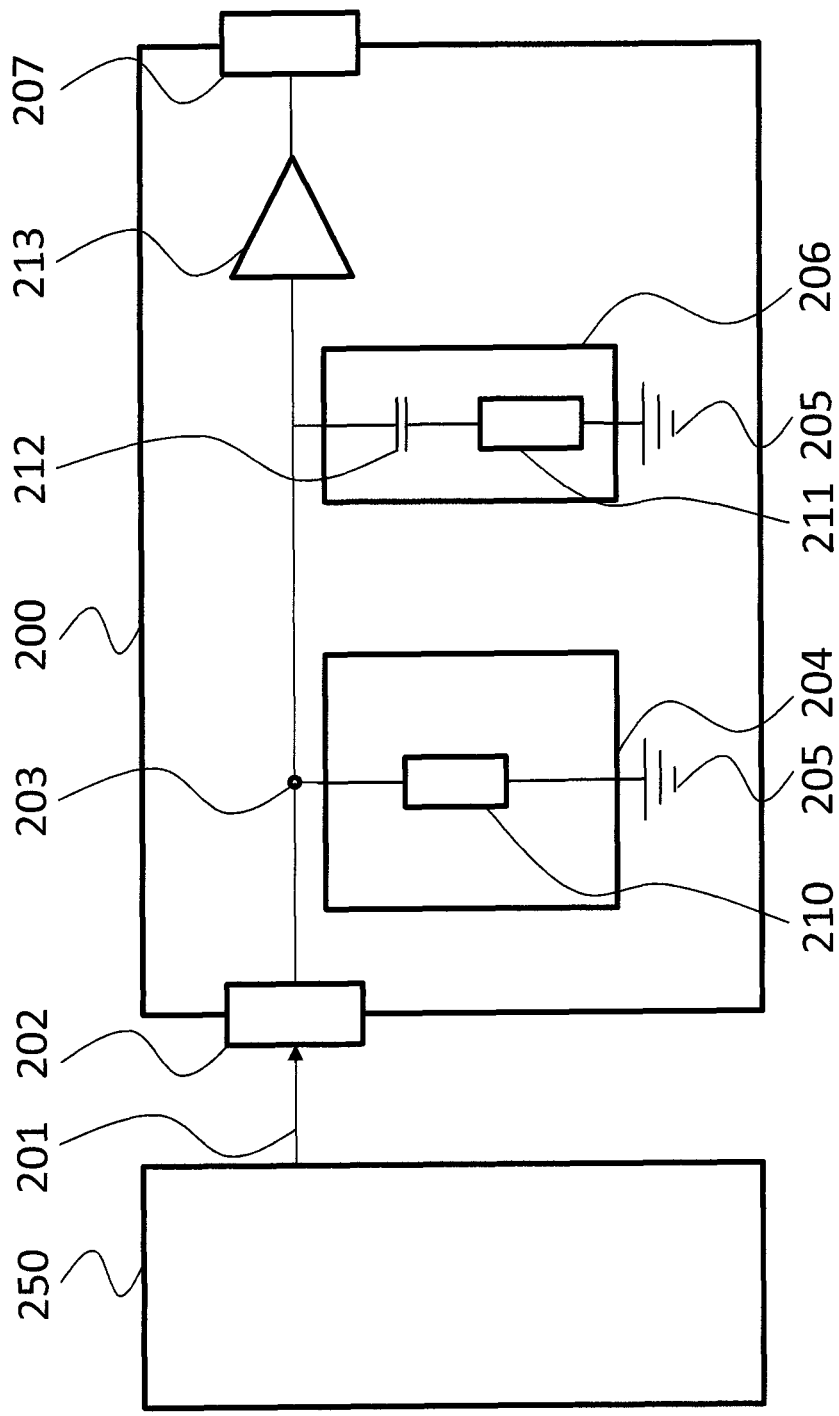
FIG. 2 shows a block diagram of another embodiment of a measurement input circuit according to the present invention.

FIG. 2 shows a block diagram of another measurement input circuit 200. The measurement input circuit 200 is based on the measurement input circuit 100 and therefore comprises a signal input 202 coupled to a signal node 203. The measurement input circuit 200 further comprises the direct signal coupling path 204 and the alternating signal coupling path 206 and the signal output 207. However, in addition to these elements, the measurement input circuit 200 comprises a measurement amplifier 213.

The measurement amplifier 213 is arranged between the signal node 203 and the signal output 207. An input of the measurement amplifier 213 is coupled to the signal node 203 and an output of the measurement amplifier 213 is coupled to the signal output 207. The measurement amplifier 213 may e.g. be a high-bandwidth amplifier that may comprise an arrangement of operational amplifiers, resistances, capacitors and the like that are coupled between the input and the output of the measurement amplifier 213. The measurement amplifier 213 amplifies the signals present at the signal node 203. Therefore, the signals may be provided at the signal output 207 in an already amplified form for further processing.

In the measurement input circuit 200 the direct signal coupling path 204 comprises a resistor 210. The resistor 210 with a first resistance value defines the impedance of the direct signal coupling path 204. The first resistance value of the resistor 210 may be a relatively high resistance value of e.g. 10 kΩ to 100 MΩ. The resistor 210 may especially be a 50 kΩ resistor or a 1 MΩ resistor or a 10 MΩ resistor. The resistor 210 may be provided e.g. as a SMD or through hole element with two electrical contacts.

Further, the alternating signal coupling path 206 comprises an alternating signal coupling element 212 with a second resistor 211 in series. The alternating signal coupling element 212 is embodied as a capacitor. The capacitor will block any DC signal part and only pass through signals with a frequency that is higher than a lower cutoff frequency of a high pass formed by the capacitor 212 and the resistor 211.

The resistor 211 comprises a second resistance value that defines the input impedance of the measurement input circuit 200 for high frequency signals. The second resistance value of the resistor 211 may be a relatively low resistance value of e.g. 1Ω to 100Ω. The resistor 211 may especially be a 50Ω resistor or a 75Ω resistor. The resistor 211 may be provided e.g. as a SMD or through hole element with two electrical contacts.

The capacitor 212 may be a discrete, e.g. SMD or through-hole element. As an alternative the capacitor 212 may also be formed by traces on a substrate, e.g. by copper traces on a PCB substrate. The capacitance value of the capacitor 212 may e.g. be between 1 μF and 100 nF, especially between 1 nF and 10 nF, and more especially of 2 nF.

Figure 3:
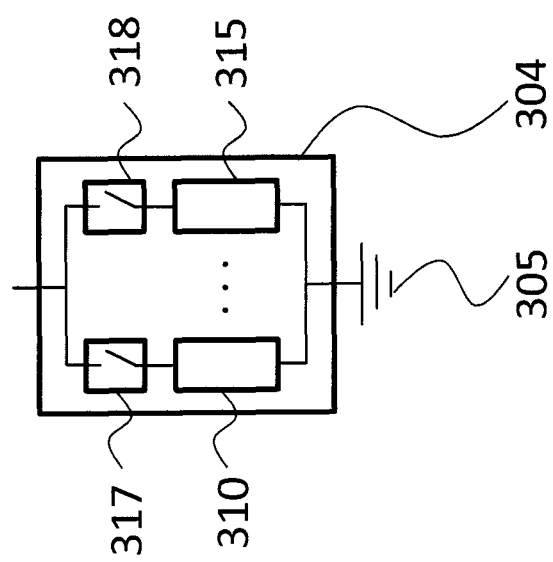
FIG. 3 shows a block diagram of an embodiment of a direct signal coupling path according to the present invention.

FIG. 3 shows a block diagram of an embodiment of a direct signal coupling path 304. The direct signal coupling path 304 is a tunable direct signal coupling path 304. This means that the resistance value of the direct signal coupling path 304 may be tuned to a desired value within certain limits.

The direct signal coupling path 304 comprises a plurality of electric series arrangements each comprising a resistor 310, 315 and a switch 317, 318. The single series arrangements are arranged in parallel in the direct signal coupling path 304.

This means that the resistors 310, 315 can controllably be connected in parallel between an input node of the direct signal coupling path 304 and an output node of the direct signal coupling path 304. It is understood, that the two resistors 310, 315 are just exemplarily shown and that any number of resistors with respective switches may be provided (hinted at by three dots). The resistors 310, 315 may all comprise the same resistance values. However, it is also possible to provide the resistors with different resistance values. Different resistance values may provide for a larger range of possible impedances of the direct signal coupling path 304.

Figure 4:
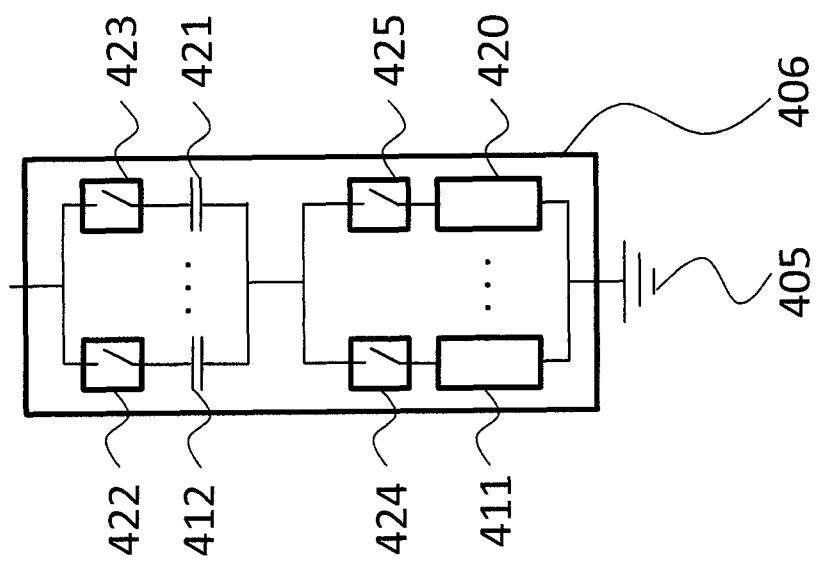
FIG. 4 shows a block diagram of an embodiment of an alternating signal coupling path according to the present invention.

FIG. 4 shows a block diagram of an embodiment of an alternating signal coupling path 406. The alternating signal coupling path 406 comprises a parallel arrangement of resistors 411, 420 and a parallel arrangement of capacitors 412, 421. Each resistor 411, 420 is arranged in series with a dedicated switch 424, 425 and each capacitor 412, 421 is arranged with a dedicated switch 422, 423.

As with the direct signal coupling path 304, the alternating signal coupling path 406 allows controllably connecting the resistors 411, 420 in parallel with the switches 424, 425.

The same applies to the capacitors 412, 421 that may also controllably be arranged electrically in parallel with the switches 422, 423.

The alternating signal coupling path 406 therefore allows controlling the capacitance value as well as the resistance value of the alternating signal coupling path 406. Therefore, the impedance and the cutoff frequency of the alternating signal coupling path 406 may be specifically modified according to the respective application.

Regarding FIGS. 3 and 4 it is understood that any type of switch 317, 318, 422, 423, 424, 425 may be used in the direct signal coupling path 304 and/or the alternating signal coupling path 406. Possible switches include discrete and manually operated switches, like e.g. DIP switches. Other possible switches include electrically controllable switches, like e.g. transistors. Possible transistors may be bipolar junction transistors, FET transistors or any other type of transistor.

It is further understood, that one of the resistors and/or the capacitors may be provided without a switch. This resistors and/or capacitors will therefore determine the standard impedance and capacitance of the direct signal coupling path and the alternating signal coupling path.

Figure 5:
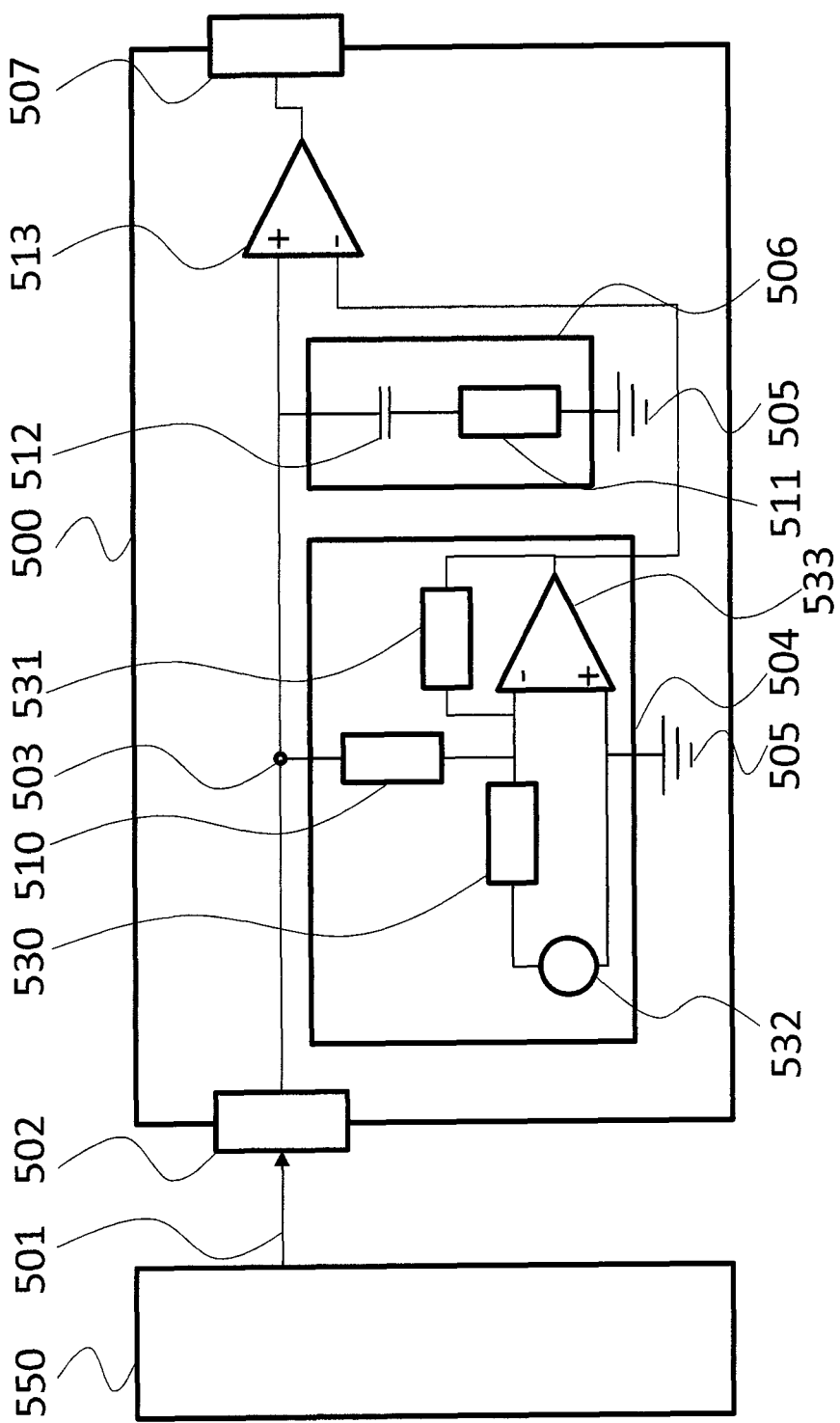
FIG. 5 shows a block diagram of an embodiment of a measurement input circuit according to the present invention.

FIG. 5 shows a block diagram of an embodiment of a measurement input circuit 500. The measurement input circuit 500 is based on the measurement input circuit 200. Therefore, the measurement input circuit 500 also comprises a signal input 502 coupled to a signal node 503, and a direct signal coupling path 504, an alternating signal coupling path 506 and the measurement amplifier 513 coupled to the signal output 507.

In the measurement input circuit 500 the measurement amplifier 513 is coupled with its first or positive input to the signal node 503. A negative input of the measurement amplifier 513 is coupled to an output of the direct signal coupling path 504.

The direct signal coupling path 504 comprises the first resistor 510 that is coupled to the signal node 503. On the other end the resistor 510 is coupled to a negative input of a differentiating circuit or amplifier 533. The positive input of the differentiating circuit or amplifier 533 is coupled to ground 505. Further, a resistor 530 is coupled to the negative input of the differentiating circuit or amplifier 533 and an offset source is coupled between the resistor 530 and ground 505. Finally, a resistor 531 is coupled between the output of the differentiating circuit or amplifier 533 and the negative input of the differentiating circuit or amplifier 533. The output of the differentiating circuit or amplifier 533 is coupled to the negative input of the measurement amplifier 513.

Figure 6:
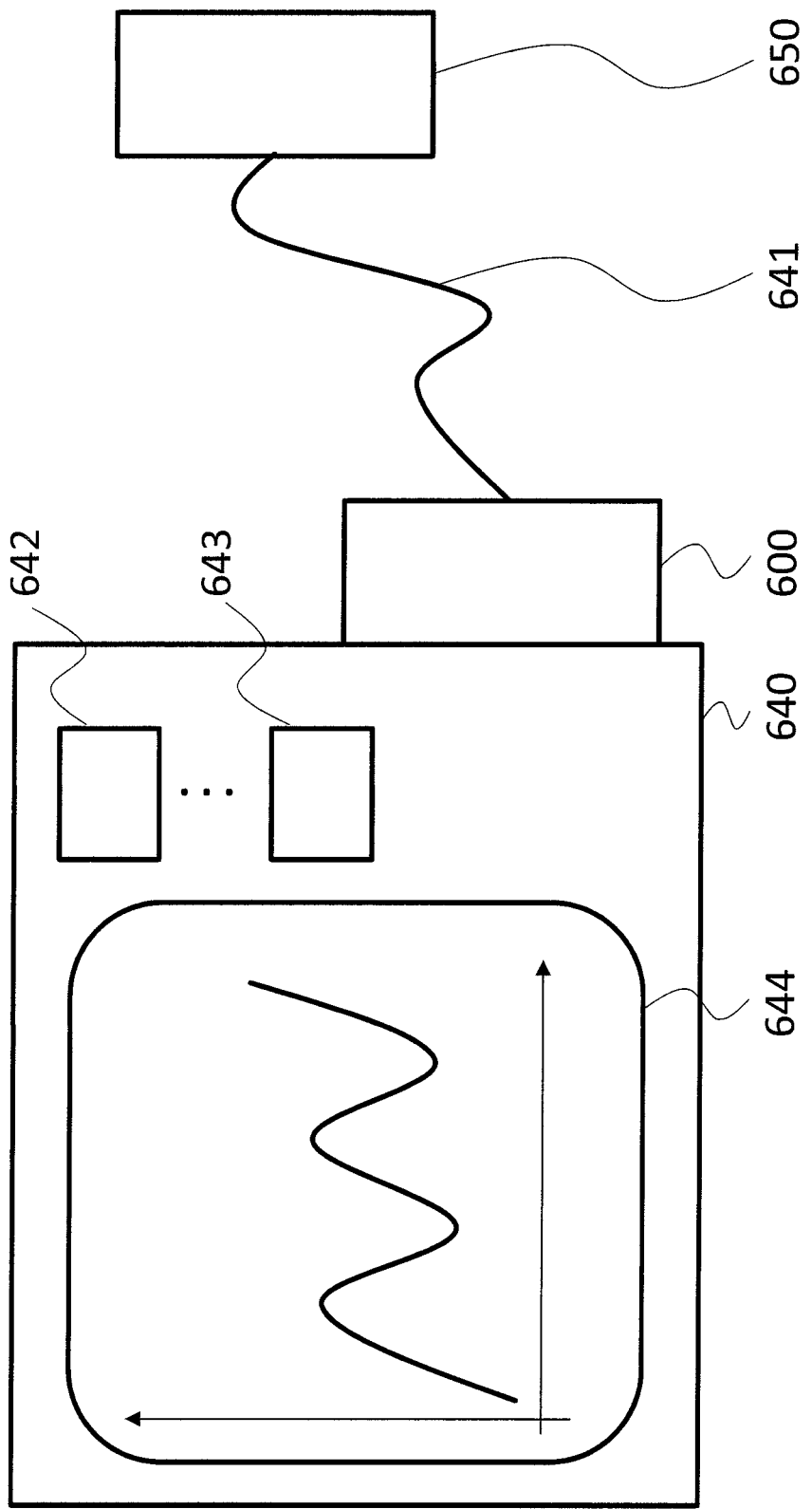
FIG. 6 shows a block diagram of an embodiment of a measurement device according to the present invention.

FIG. 6 shows a block diagram of a measurement device 640. The measurement device 640 may e.g. be an oscilloscope that comprises a measurement input circuit 600. The measurement input circuit 600 may be any embodiment of the measurement input circuit 600 as described above in conjunction with FIGS. 1-5.

The measurement device 640 may be coupled via the measurement input circuit 600 and a cable 641 to the device under test 650. As already explained above, the measurement input circuit 600 allows the measurement device 640 to measure electric signals within a large frequency range from DC signals to frequencies of e.g. several GHz. This allows measuring signals of devices under test 650 that comprise a plurality of different frequencies. This may e.g. be the case with devices that may switch between different operating modes. Such devices may e.g. transmit control data via a low speed bus, e.g. a 100 kHz control bus, and data via a high speed data transmission, e.g. in the GHz range. Such signals may e.g. be provided by MIPI-Alliance compatible devices.

The measurement device 640 may comprise user input devices 642, 643 that may allow a user to configure the measurement device 640. The user input devices 642, 643 may e.g. be used to configure the measurement input circuit 600. As indicated above the direct signal coupling path and the alternating signal coupling path of the measurement input circuit 600 may be tunable. The user input devices 642, 643 may therefore be used to tune the measurement input circuit 600. The user input devices 642, 643 may e.g. be used to control the switches as shown in FIGS. 3 and 4. The user input devices 642, 643 may therefore be used to set the impedance of the direct signal coupling path and the impedance and capacitance of the alternating signal coupling path of the measurement input circuit. Although not explicitly shown, it is understood that dedicated control lines may be provided between the measurement device 640 and the switches in the measurement input circuit 600.

The measurement input circuit 600 further comprises a display 644 that may be used to display the measured electric signals.

The measurement input circuit 600 is shown as coupled to the measurement device 640. However, it is understood that at least some of the elements of the measurement input circuit 600 may also be distributed in the measurement device 640.

As an example, the direct signal coupling path may e.g. be provided in a separate housing and the alternating signal coupling path may be provided in the measurement device 640. The separate housing may then be connected to the measurement device 640 e.g. via a dedicated port.

Although not explicitly mentioned, it is understood, that the measurement device 640 may comprise any other element that is necessary to perform the function of the measurement device 640. Such devices may e.g. include A/D-converters, D/A-converters, processors, memory devices and the like.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS

100, 200, 500, 600 measurement input circuit
101, 201, 501 electric signal
102, 202, 502 signal input
103, 203, 503 signal node
104, 204, 304, 504 direct signal coupling path
105, 205, 305, 405, 505 electrical ground
106, 206, 306, 506 alternating signal coupling path
107, 207, 507 signal output
210, 310, 315, 510 first resistor
211, 411, 420, 511 second resistor
212, 412, 421, 512 capacitor
213, 513 measurement amplifier
317, 318 switch
422, 423, 424, 425 switch
530, 531 resistor
532 offset source
533 differentiating circuit
640 measurement device
641 cable
150, 250, 550, 650 device under test

The invention claimed is:

1. A measurement input circuit for a measurement device for measuring an electric signal in a device under test, the measurement input circuit comprising:
    a user interface that receives a selection of a measurement mode according to requirements of a respective measurement task;
    a signal input that receives the electronic signal from the device under test and provides the received electronic signal at a signal node,
    a direct signal coupling path that is coupled between the signal node and an electrical ground and comprises a first impedance value,
    an alternating signal coupling path that is coupled between the signal node and the electrical ground, and comprises a second impedance value that is lower than the first impedance value, and
    a signal output that is coupled to the signal node and outputs the received electronic signal,
    wherein the direct signal coupling path comprises a first resistor with a first resistance between the signal node and the electrical ground, the first resistor comprises a first tunable resistor and is tunable to at least two first resistance values between 10 kΩ and 100 MΩ; and wherein the alternating signal coupling path comprises an alternating signal coupling element with a second resistor with a second resistance in series between the signal node and the electrical ground, and the alternating signal coupling element comprises a tunable capacitor that is tunable to at least two capacitance values between 1 µF and 100 nF;

wherein the measurement input circuit comprises a controller that tunes the first resistor, the second resistor and the capacitor according to a selected predetermined measurement mode according to requirements of a respective measurement task received from the user interface, wherein the predetermined measurement mode according to the respective measurement task is selected based on an operating mode of the device under test, wherein the alternating signal coupling path comprises a frequency dependent filter and a cutoff frequency of the alternating signal coupling path is set according to the requirements of the respective measurement task.

2. The measurement input circuit according to claim 1, wherein the first resistor is tunable to a 50 kΩ resistance or a 75 kΩ resistance or a 100 kΩ resistance.

3. The measurement input circuit according to claim 1, wherein the capacitor is tunable to 1 nF and 2 nF and 5 nF.

4. The measurement input circuit according to claim 1, wherein the second resistor comprises a second tunable resistor and is tunable to at least two second resistance values between 10 Ω and 100 Ω.

5. The measurement input circuit according to claim 1, comprising a measurement amplifier, wherein an input port of the measurement amplifier is connected to the signal node.

6. The measurement input circuit according to claim 5, wherein the measurement amplifier is a broadband amplifier with a bandwidth between 1 GHz and 100 GHz.

7. A measurement device for measuring an electronic signal in a device under test, the measurement device comprising a measurement input circuit, the measurement input circuit comprising:
  a user interface that receives a selection of a measurement mode according to requirements of a respective measurement task;
  a signal input that receives the electronic signal from the device under test and provides the received electronic signal at a signal node,
  a direct signal coupling path that is coupled between the signal node and an electrical ground and comprises a first impedance value,
  an alternating signal coupling path that is coupled between the signal node and the electrical ground, and comprises a second impedance value that is lower than the first impedance value, and
  a signal output that is coupled to the signal node and outputs the received electronic signal,
  wherein the direct signal coupling path comprises a first resistor with a first resistance between the signal node and the electrical ground, the first resistor comprises a first tunable resistor and is tunable to at least two first resistance values; and
  wherein the alternating signal coupling path comprises an alternating signal coupling element with a second resistor with a second resistance in series between the signal node and the electrical ground, and the alternating signal coupling element comprises a tunable capacitor that is tunable to at least two capacitance values between 1 µF and 100 nF;
  wherein the measurement input circuit comprises a controller that tunes the first resistor, the second resistor and the capacitor are set according to the received selection of the measurement mode received from the user interface, and
  wherein the alternating signal coupling path comprises a frequency dependent filter and a cutoff frequency of the alternating signal coupling path is set according to the requirements of the respective measurement task.

8. The measurement device according to claim 7, wherein the first resistor is tunable to resistance values between 10 kΩ and 100 MΩ.

9. The measurement device according to claim 7, wherein the capacitor is tunable to 1 nF and 2 nF and 5 nF.

10. The measurement device according to claim 7, wherein the second resistor comprises a second tunable resistor and is tunable to at least two first resistance values, especially resistance values between 10 Ω and 100 Ω.

11. The measurement device according to claim 7, comprising a measurement amplifier, wherein an input port of the measurement amplifier is connected to the signal node.

12. The measurement device according to claim 11, wherein the measurement amplifier is a broadband amplifier with a bandwidth between 1 GHz and 100 GHz.

* * * * *